United States Patent
Maeda et al.

(10) Patent No.: US 8,433,267 B2
(45) Date of Patent: Apr. 30, 2013

(54) AMPLITUDE MODULATOR

(75) Inventors: Masakatsu Maeda, Osaka (JP); Taichi Ikedo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/380,687

(22) PCT Filed: Apr. 8, 2010

(86) PCT No.: PCT/JP2010/002580
§ 371 (c)(1),
(2), (4) Date: Dec. 23, 2011

(87) PCT Pub. No.: WO2011/007481
PCT Pub. Date: Jan. 20, 2011

(65) Prior Publication Data
US 2012/0094712 A1 Apr. 19, 2012

(30) Foreign Application Priority Data
Jul. 15, 2009 (JP) .................... 2009-166996

(51) Int. Cl.
*H04B 1/04* (2006.01)

(52) U.S. Cl.
USPC .................. 455/127.1; 455/550.1; 455/343.1; 333/132

(58) Field of Classification Search ............... 455/127.1, 455/561, 343.1, 550.1; 333/132
See application file for complete search history.

(56) References Cited

U.S. PATENT DOCUMENTS

| 5,991,416 | A | * | 11/1999 | Bae | 380/39 |
| 6,590,940 | B1 | | 7/2003 | Camp, Jr. et al. | |
| 8,026,775 | B2 | * | 9/2011 | Meharry | 333/132 |

(Continued)

FOREIGN PATENT DOCUMENTS

| JP | 2003-500873 | 1/2003 |
| JP | 2004-146868 | 5/2004 |

(Continued)

OTHER PUBLICATIONS

International Search Report issued Jul. 13, 2010 in corresponding International Application No. PCT/JP2010/002580.

(Continued)

*Primary Examiner* — Danh Le
(74) *Attorney, Agent, or Firm* — Wenderoth, Lind & Ponack, L.L.P.

(57) ABSTRACT

An amplitude modulator comprises: a signal processing section for receiving a source signal for wide bandwidth use, splitting the source signal into two source signals for lower frequency use and for higher frequency use, respectively, signal processing the two source signals individually, and outputting a lower-frequency-use source signal and a higher-frequency-use source signal; a first modulation section for modulating the lower-frequency-use source signal and outputting a lower-frequency-use modulation signal; a second modulation section for modulating the higher-frequency-use source signal and outputting a higher-frequency-use modulation signal; a synthesis output section for inputting the lower-frequency-use modulation signal to a first input terminal, the input thereof causing extraction of only a lower-frequency component, for inputting the higher-frequency-use modulation signal to a second input terminal, the input thereof causing extraction of only a higher-frequency component, for synthesizing the higher-frequency component and the lower-frequency component, and for outputting a modulated signal corresponding to the source signal for wide bandwidth use, to a next step.

6 Claims, 5 Drawing Sheets

U.S. PATENT DOCUMENTS

| | | | |
|---|---|---|---|
| 2003/0095013 A1 | 5/2003 | Melanson et al. | |
| 2005/0164660 A1 | 7/2005 | Matsuura et al. | |
| 2008/0139138 A1 | 6/2008 | Matsuura et al. | |
| 2008/0217607 A1 | 9/2008 | Deb | |
| 2009/0011728 A1* | 1/2009 | Kawamoto et al. | 455/127.1 |
| 2010/0109769 A1 | 5/2010 | Yamanouchi | |

FOREIGN PATENT DOCUMENTS

| | | |
|---|---|---|
| JP | 2005-244950 | 9/2005 |
| JP | 2006-512004 | 4/2006 |
| JP | 2009-16999 | 1/2009 |
| WO | 2008/090712 | 7/2008 |

OTHER PUBLICATIONS

Min-Chul Lee et al., "A 4-W Master-Slave Switching Amplitude Modulator for Class-E1 EDGE Polar Transmitters", IEEE Transactions on Circuits and Systems-II: Express Briefs, vol. 55, No. 5, May 2008, pp. 484-488.

Tae-Woo Kwak et al., "A 2 W CMOS Hybrid Switching Amplitude Modulator for EDGE Polar Transmitters", IEEE Journal of Solid-State Circuits, vol. 42, No. 12, Dec. 2007, pp. 2666-2676.

Takashi Oshima et al., "Simple Polar-Loop Transmitter for Dual-Mode Bluetooth", IEEE International Symposium on Circuits and Systems, 2005, pp. 3966-3969.

* cited by examiner

AMPLITUDE MODULATOR

TECHNICAL FIELD

The present invention relates to an amplitude modulator, and more particularly to a technology for widening a bandwidth while suppressing an increase in power consumption and an increase of a chip area.

BACKGROUND ART

In recent years, performance of mobile phones has been greatly improved and new standards have been established one after another.

For example, in order to meet a next generation LTE (Long Term Evolution) standard, it is indispensable to widen the bandwidth of an amplitude modulator. However, if a conventional technology is employed to design an amplitude modulator having a widened bandwidth, an operational amplifier having a very wide bandwidth characteristic is needed. Accordingly, an increase in power consumption and an increase in a chip area cannot be avoided, and moreover, phase compensation for preventing oscillation becomes difficult.

On the other hand, with respect to a mobile phone, there is a very strong demand for a longer-life battery, reduction in size and weight, and low costs. Therefore, an increase in power consumption and an increase in a chip area are not desirable.

Conventional amplitude modulators are described in detail in Non-Patent Literatures 1 to 3.

Since conventional amplitude modulators are mostly configured by analog circuits, reduced power consumption as a result of miniaturization of CMOS and reduction of a chip area cannot be expected, unlike in a digital circuit. Moreover, since there is a wide variation in DC offsets, group delays, and the like due to property variations among components, a separate circuit for compensating them is necessary to improve performance.

CITATION LIST

Non Patent Literature

[NPL 1] A4-W Master-Slave Switching Amplitude Modulator for Class-E1 EDGE Polar Transmitters/IEEE TRANSACTIONS ON CIRCUITS AND SYSTEMS_II:EXPRESS BRIEFS, VOL. 55, No. 5, MAY 2008, pp. 484-488
[NPL 2] A 2 W CMOS Hybrid Switching Amplitude Modulator for EDGE Polar Transmitters/IEEE JOURNAL OF SOLID-STATE CIRCUITS, VOL. 42, No. 12, DECEMBER 2007, pp. 2666-2676
[NPL 3] SIMPLE POLAR-LOOP TRANSMITTER FOR DUAL-MODE BLUETOOTH/IEEE International Symposium on Circuits and Systems 2005, pp. 3966-3969, 2005

SUMMARY OF THE INVENTION

Problems to be Solved by the Invention

Therefore, it is desired to design a wideband amplitude modulator, not by applying a conventional technology to the designing but by using a new technology.

Therefore, an object of the present invention is to provide an amplitude modulator that realizes a widened bandwidth while suppressing adverse effects, such as an increase in power consumption and an increase in a chip area which result from the widened bandwidth, and a mobile phone provided with the amplitude modulator.

Solution to the Problems

The present invention is directed to an amplitude modulator and a mobile phone including the amplitude modulator. In order to solve the above problems, the amplitude modulator according to the present invention includes: a signal processing section for receiving a source signal for wide bandwidth use, splitting the received source signal into two source signals which are for lower frequency use and for higher frequency use, respectively, signal processing the two source signals individually, and outputting a lower-frequency-use source signal and a higher-frequency-use source signal; a first modulation section for modulating the lower-frequency-use source signal outputted by the signal processing section and outputting a lower-frequency-use modulation signal; a second modulation section for modulating the higher-frequency-use source signal outputted by the signal processing section and outputting a higher-frequency-use modulation signal; a synthesis output section for inputting the lower-frequency-use modulation signal outputted by the first modulation section to a first input terminal, the input of the lower-frequency-use modulation signal causing extraction of only a lower-frequency component, for inputting the higher-frequency-use modulation signal outputted by the second modulation section to a second input terminal, the input of the higher-frequency-use modulation signal causing extraction of only a higher-frequency component, for synthesizing the higher-frequency component and the lower-frequency component, and for outputting a modulated signal which corresponds to the source signal for wide bandwidth use, to a next step.

Preferably, in the synthesis output section, the first input terminal is a positive side input terminal of an operational amplifier, a resistance is connected in series to an output terminal of the operational amplifier, and a capacitor is connected in parallel with a line in which the resistance is provided, an end of the line is connected to a gate of an output transistor, and serves as the second input terminal, and a source of the output transistor is connected to a negative side input terminal of the operational amplifier, and serves as an output to the next step.

Preferably, the signal processing section includes a delay section which performs delay process on at least one of the lower-frequency-use source signal and the higher-frequency-use source signal so as to prevent a time lag therebetween in the synthesis output section. Preferably, the signal processing section includes a correction section which corrects the higher-frequency-use source signal so as to cancel out an output distortion which has been measured in advance.

Preferably, the source signal is multiple-bit digital data, the signal processing section outputs two 1 bit digital signals which are for lower frequency use and higher frequency use, respectively, as the lower-frequency-use source signal and the higher-frequency-use source signal, respectively, the first modulation section receives the lower-frequency-use 1 bit digital signal, shifts up a signal level thereof, and outputs an analog voltage signal obtained by time-averaging the lower-frequency-use 1 bit digital signal whose signal level has been shifted up, as the lower-frequency-use modulation signal, and the second modulation section receives the higher-frequency-use 1 bit digital signal, shifts up a signal level thereof, and outputs an analog voltage signal obtained by time-averaging the higher-frequency-use 1 bit digital signal whose signal level has been shifted up, as the higher-frequency-use modulation signal.

Further, the mobile phone according to the present invention includes the amplitude modulator of the present invention; and a communication circuit which realizes a call function by use of the amplitude modulator.

Advantageous Effects of the Invention

As described above, in the present invention, a source signal is split into two source signals which are for lower frequency use and for higher frequency use, respectively. The source signal for lower frequency use is inputted to a first input terminal, the input thereof causing extraction of only a lower-frequency component. The source signal for higher frequency use is inputted to a second input terminal, the input of thereof causing extraction of only a higher-frequency component. The two components are synthesized together to generate an output signal having a wider bandwidth. Accordingly, it is possible to realize a modulation having a wider bandwidth without using a wideband operational amplifier. Therefore, it is possible to suppress adverse effects that occur due to widened bandwidth such as an increase in power consumption and an increase in a chip area.

Further, according to the present invention, the control of gain, DC voltage, and the like can be processed by a digital circuit using the digital signal without being altered. Therefore it is possible to expect lower power consumption due to miniaturization of CMOS, and reduction of chip areas. Moreover, it is possible to reduce a variation in DC offsets, group delays, and the like due to property variations among components.

DESCRIPTION OF EMBODIMENTS

First Embodiment

<Outline>

The present embodiment is directed to an amplitude modulator used in a mobile phone or the like. In the amplitude modulator, in order to realize a wide bandwidth modulation, a source signal for wide bandwidth use is split into two source signals which are for lower frequency use and for higher frequency use, respectively. The lower-frequency-use source signal is modulated, and then inputted into a first input terminal for causing extraction of only lower-frequency components. The higher-frequency-use source signal is subjected to a delay adjustment and a correction process for canceling out a distortion characteristic of an output transistor, and then to modulation. Then, the resultant higher-frequency-use source signal is inputted to a second input terminal for causing extraction of only higher-frequency components. From the output transistor, an output signal is obtained which is obtained by synthesizing lower-frequency components of the modulated lower-frequency-use signal and higher-frequency components of the modulated higher-frequency-use signal.

<Structure>

Figure 1:
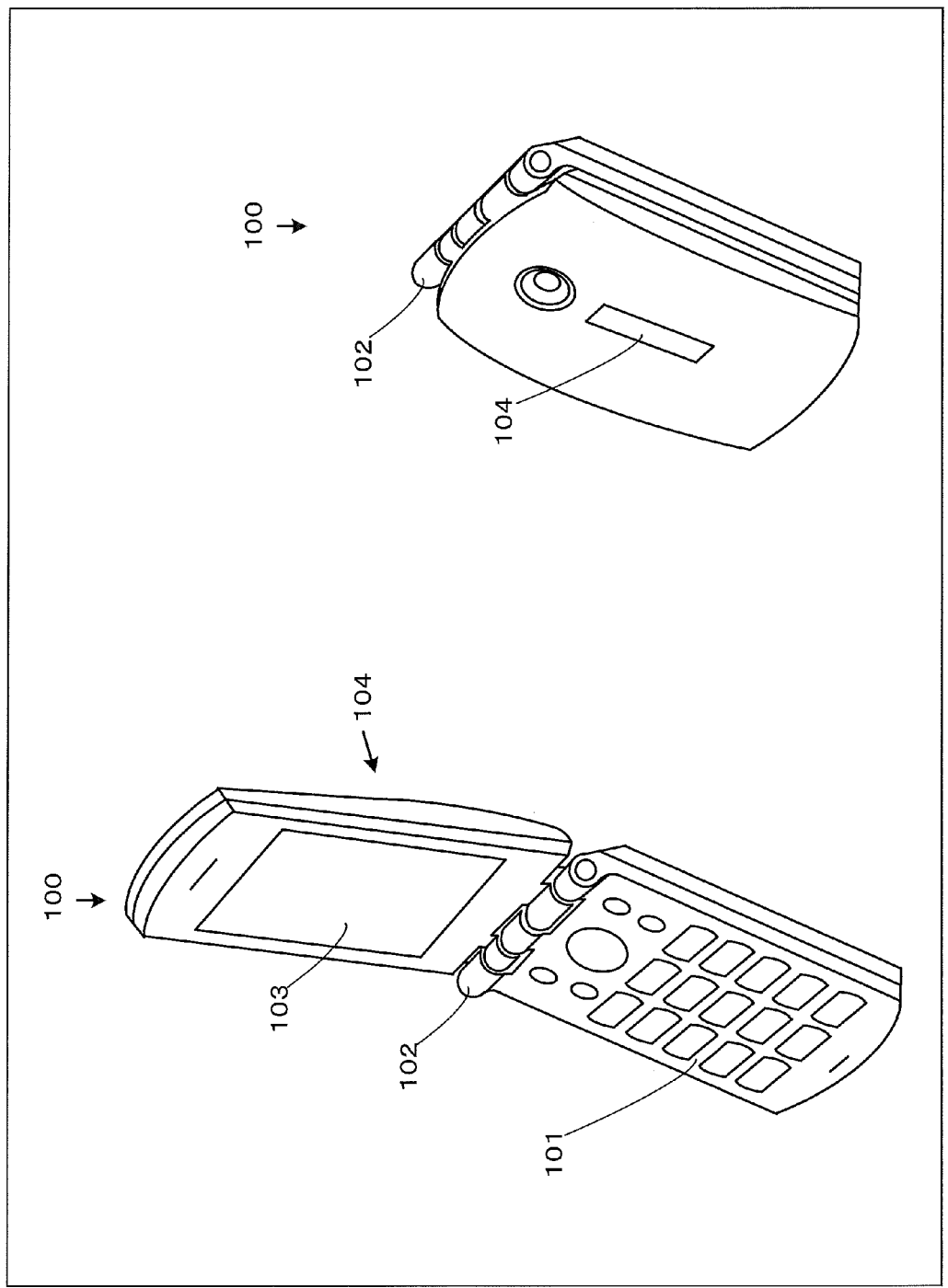
FIG. 1 shows an appearance of a mobile phone 100 according to the present invention.

FIG. 1 shows an appearance of a mobile phone 100 according to the present invention.

Here, the left figure in FIG. 1 shows the mobile phone 100 in a state where a flip is opened, and the right figure shows the mobile phone 100 in a state where the flip is closed.

The mobile phone 100 of a first embodiment is a mobile phone, for example, having an opening and closing function by means of a flip. As shown in FIG. 1, the mobile phone 100 includes an operation section 101, an opening and closing section 102, a first display section 103, and a second display section 104.

The operation section 101 is implemented as operation buttons such as a numerical keypad and receives an operation by a user, an input from the user, and the like.

The opening and closing section 102 is a portion that has an opening and closing function, for example, by means of a flip. When the flip is closed, the first display section 103 and the operation section 101 are hidden inside, and cannot be seen by the user any more.

The second display section 104 is a sub LCD, for example, and displays a watch or a part of information that the user would like to know about the sender of a call or mail when it has arrived, with the flip closed. The second display section 104 is located at a position where it can be seen whether the flip is opened or closed.

The first display section 103 is a main LCD, for example, and displays all information that should be displayed, including the contents displayed on the second display section 104.

Moreover, the mobile phone 100 includes an amplitude modulator (not shown) inside thereof.

<Description of Operation Principle of Amplitude Modulator>

Figure 2:
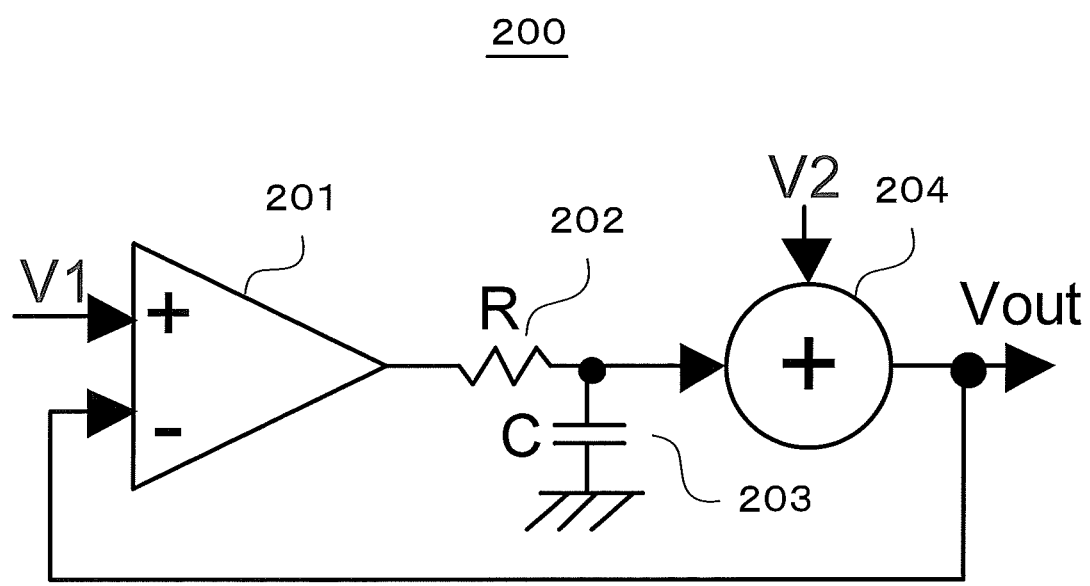
FIG. 2 is a schematic diagram for illustrating an operation principle of a wideband amplitude modulator.

FIG. 2 is a schematic diagram for illustrating the principle of widening the bandwidth for an amplitude modulator.

As shown in FIG. 2, an amplitude modulator 200 includes an operational amplifier 201 to which a negative feedback is applied, a resistance 202 ("R" in FIG. 2) connected in series to an output terminal of the operational amplifier 201, a capacitor 203 ("C" in FIG. 2) connected in parallel with the line in which the resistance 202 is provided, and a signal synthesizer 204 which synthesizes a test input signal V2 into the line. Moreover, a test input signal V1 is inputted to a + (positive) input terminal of the operational amplifier 201. An output from the signal synthesizer 204 serves as an output Vout, and is also fed to a − (negative) input terminal of the operational amplifier 201, thereby applying a negative feedback thereto.

When the angular velocity ω of an input signal is $2\pi \times 10^3$, $2 \times 2\pi \times 10^3$, $3 \times 2\pi \times 10^3$, $2\pi \times 10^4$, $2 \times 2\pi \times 10^4$, $3 \times 2\pi \times 10^4$, . . . $2\pi \times 10^7$, the current value of the input signal is expressed as $S(\omega)=\omega i$. The output Vout of the amplitude modulator 200 in FIG. 2 is expressed by the following equation 1 and equation 2.

$$Vout=[A \cdot F(\omega)/\{1+A \cdot F(\omega)\}]V1+[1/\{1+A \cdot F(\omega)\}]V2 \quad \text{equation 1}$$

$$F(\omega)=1/\{C \cdot R \cdot S(\omega)+1\} \quad \text{equation 2}$$

Further, it is assumed that the gain A of the operational amplifier 201=1000, the resistance value R of the resistance 202=1×10$^4$ [Ω], and the capacity C of the capacitor 203=1×10$^{-8}$ [F].

Figure 3:
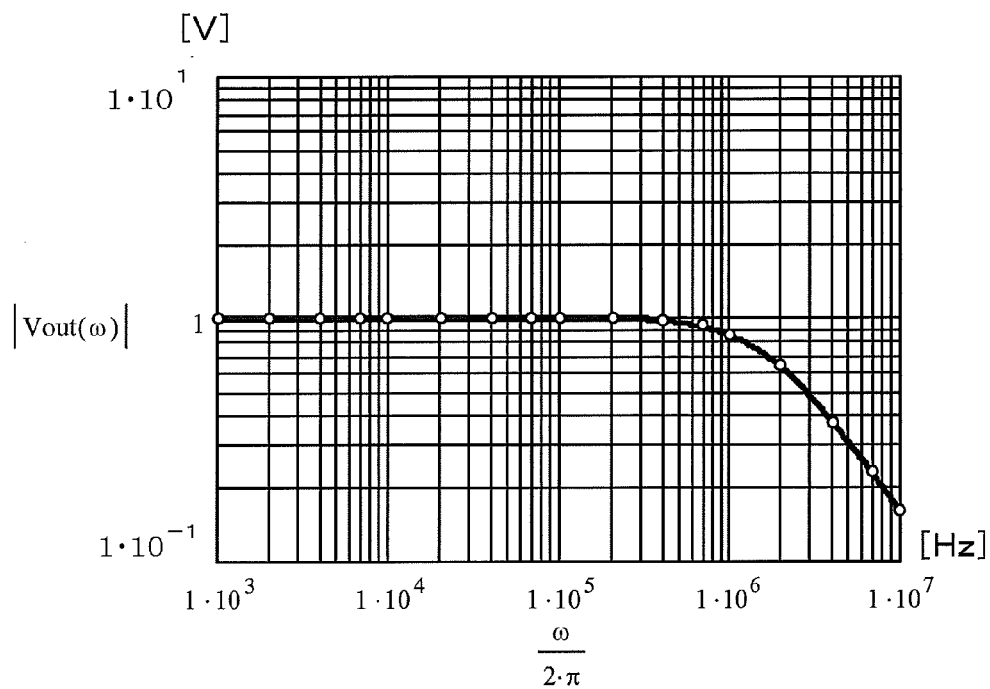
FIG. 3 shows a result of simulation of an output Vout response to a sinusoidal input, by use of equation 1 and equation 2, and represents a characteristic of a first input terminal for causing extraction of only lower-frequency components.
Figure 4:
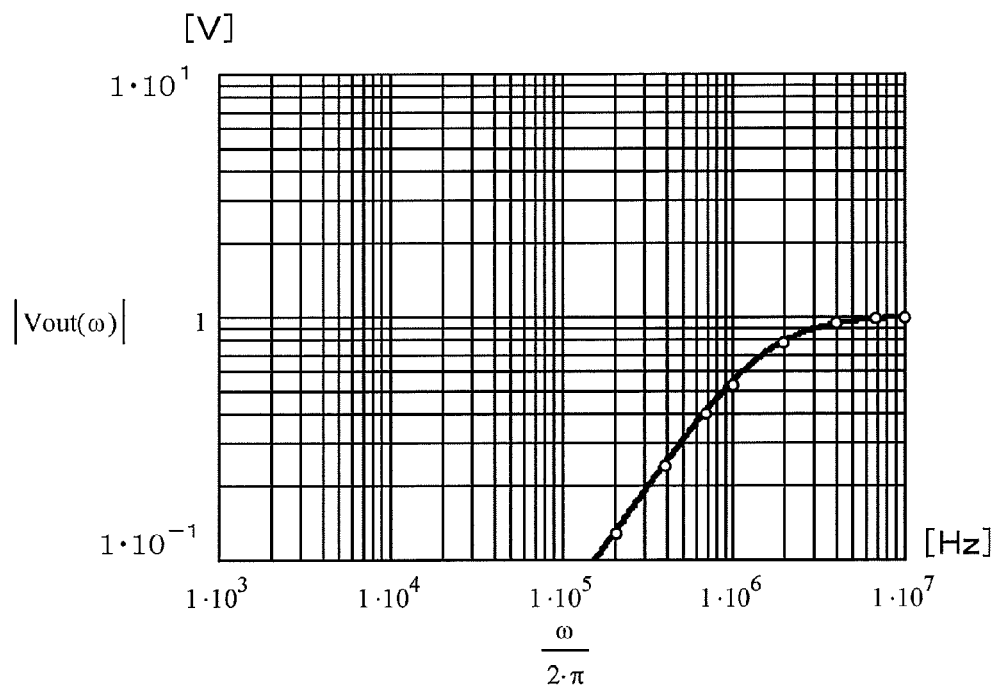
FIG. 4 shows a result of simulation of an output Vout response to a sinusoidal input, by use of equation 1 and equation 2, and represents a characteristic of a second input terminal for causing extraction of only higher-frequency components.
Figure 5:
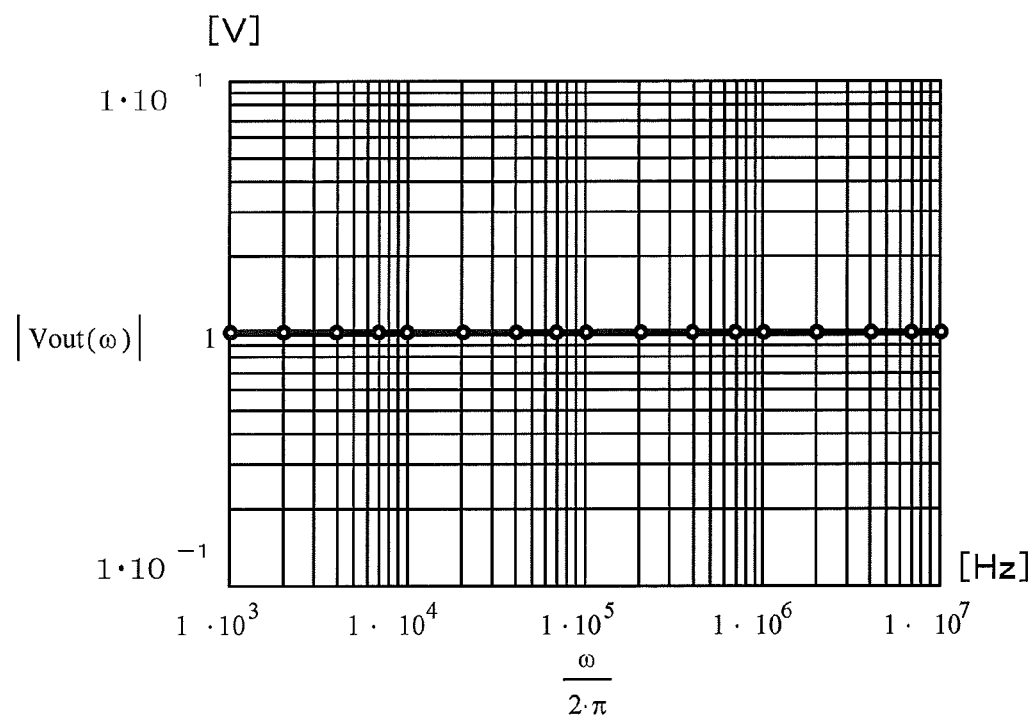
FIG. 5 shows a result of simulation of an output Vout response to a sinusoidal input, by use of equation 1 and equation 2, and represents an overall characteristic of an amplitude modulator.

Each of FIG. 3, FIG. 4, and FIG. 5 shows a result of simulation of the output Vout response to a sinusoidal input, by use of equation 1 and equation 2 above. Here, the vertical axis represents the output |Vout(ω)| [V], the horizontal axis represents the signal frequency ω/2π [Hz] of an input signal, and values of the output |Vout(ω)| [V] corresponding to the range of 1×10$^3$ to 1×10$^7$ are calculated. FIG. 3 represents a characteristic of the first input terminal for causing extraction only of lower-frequency components, where the test input signal V1=1 [V] and the test input signal V2=0 [V]. FIG. 4 represents a characteristic of the second input terminal for causing extraction only higher-frequency components, where the test input signal V1=0 [V] and the test input signal V2=1 [V]. FIG. 5 represents an overall characteristic of the amplitude modulator 200 where the test input signal V1=1 [V] and the test input signal V2=1 [V].

As seen from FIG. 3, when only the test input signal V1 is inputted, the output |Vout(ω)| [V] is attenuated in accordance with an increase of the signal frequency of the input signal starting at about 3×10$^5$, and is outputted without being attenuated at lower frequencies than that.

As seen from FIG. 4, when only the test input signal V2 is inputted, the output |Vout(ω)| [V] increases in accordance with an increase of the signal frequency of the input signal starting at about 1.5×10$^5$, and is hardly outputted at frequencies lower than that.

As seen from FIG. 5, when both of the test input signal V1 and the test input signal V2 are inputted, the respective attenuated portions are complemented with each other, and the output |Vout(ω)| [V] is uniformly outputted without being attenuated, from lower signal frequencies to higher signal frequencies of the input signals.

<Configuration>

Figure 6:
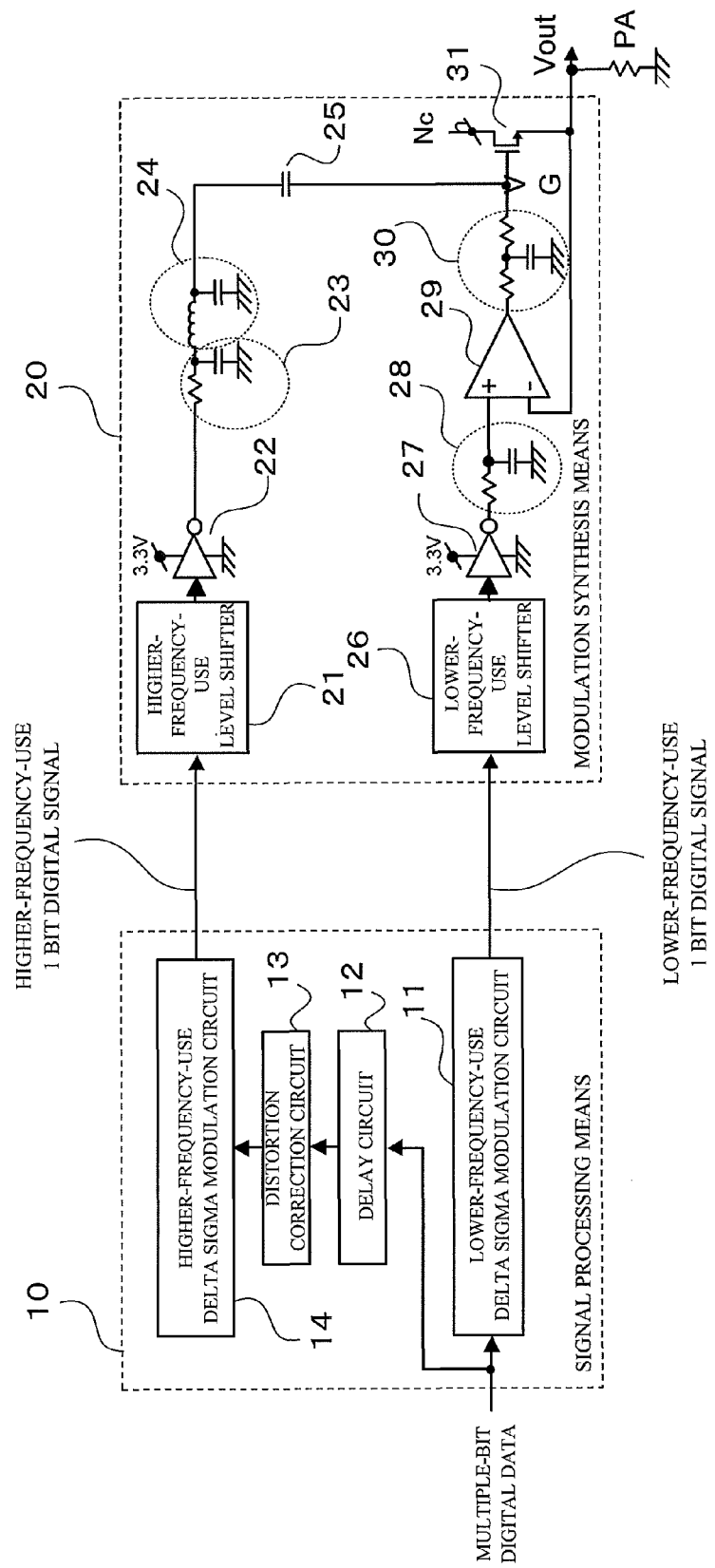
FIG. 6 is a schematic view of an amplitude modulator 1 according to a first embodiment of the present invention.

FIG. 6 is a schematic view of an amplitude modulator 1 according to the first embodiment of the present invention.

The amplitude modulator 1 includes signal processing means 10 and modulation synthesis means 20. Here, with reference to FIG. 6, an output line of the modulation synthesis means 20 is connected to a next step circuit PA (shown by a symbol of resistance since the circuit PA is equivalent to a resistance).

The signal processing means 10 receives a source signal for wide bandwidth use and splits the source signal into two signals which are for lower frequency use and for higher frequency use, respectively, signal processes the two signals individually, and outputs a lower-frequency-use source signal and a higher-frequency-use source signal. In the present embodiment, the signal processing means 10 is implemented as a group of digital circuits including a lower-frequency-use delta sigma modulation circuit 11, a delay circuit 12, a distortion correction circuit 13, and a higher-frequency-use delta sigma modulation circuit 14. The signal processing means 10 receives multiple-bit digital data such as 12+8 bit data as a source signal for wide bandwidth use, and outputs two 1 bit digital signals which are for lower-frequency use and for higher frequency use, respectively.

The lower-frequency-use delta sigma modulation circuit 11 generates a 1 bit digital signal for lower-frequency use from the multiple-bit digital data. Since the method of generating a 1 bit digital signal from multiple-bit digital data is known, detailed description thereof will be omitted.

The delay circuit 12 performs delay adjustment by delaying the signal for lower-frequency-use so as to prevent a lag from occurring between the signal for higher-frequency use and the signal for lower-frequency use when they are synthesized later. In order to adjust the amount of a variation of the delay time due to temperature, an appropriate delay time is measured for each temperature and stored in advance, and delay adjustment may be performed by use of the delay time corresponding to the temperature of the time, with the temperature being monitored.

The distortion correction circuit 13 mainly performs a correction process for canceling out a distortion characteristic of an output transistor 31. Compared with the circuit shown in FIG. 2, the amplitude modulator 1 in FIG. 6 includes the output transistor 31. Accordingly, higher-frequency components tend to be more attenuated than lower-frequency components, due the distortion characteristic of the output transistor 31. Therefore, the higher-frequency components are made greater in advance by the amount of the attenuation and then outputted, thereby canceling out the distortion characteristic.

The higher-frequency-use delta sigma modulation circuit 14 generates a 1 bit digital signal for higher-frequency use from the multiple-bit digital data outputted by the distortion correction circuit 13.

The modulation synthesis means 20 receives the lower-frequency-use source signal and the higher-frequency-use source signal and modulates the signals individually, synthesizes these signals, and finally outputs a modulated signal which corresponds to the source signal for wide bandwidth use, to a next step. In the present embodiment, the modulation synthesis means 20 includes a higher-frequency-use level shifter 21, a higher-frequency-use inverter driver 22, a higher-frequency-use storage circuit 23, a filter 24, a coupling capacitor 25, a lower-frequency-use level shifter 26, a lower-frequency-use inverter driver 27, a lower-frequency-use storage circuit 28, an operational amplifier 29, a filter 30, and the output transistor 31. The modulation synthesis means 20 receives the two 1 bit digital signals which are for lower-frequency use and for higher-frequency use. First modulation means including the higher-frequency-use level shifter 21, the higher-frequency-use inverter driver 22, the higher-frequency-use storage circuit 23, the filter 24, and the coupling capacitor 25 performs Class-D amplification on the higher-frequency-use 1 bit digital signal. Second modulation means including the lower-frequency-use level shifter 26, the lower-frequency-use inverter driver 27, and the lower-frequency-use storage circuit 28 performs Class-D amplification on the lower-frequency-use 1 bit digital signal. Synthesis output means including the operational amplifier 29, the filter 30, and the output transistor 31 synthesizes higher-frequency components outputted by the first modulation means and lower-frequency components outputted by the second modulation means, and finally outputs an modulated analog signal which corresponds to the digital data for wide bandwidth use, to the next step. Here, remaining components of the modulation synthesis means 20 excluding the higher-frequency-use storage circuit 23, the filter 24, and the coupling capacitor 25 therefrom can be collectively mounted on a one-chip integrated circuit.

The higher-frequency-use level shifter 21 shifts up the output level of the higher-frequency-use 1 bit digital signal. Here the output level is shifted up from 1.2 V to 3.3 V.

The higher-frequency-use inverter driver 22 outputs the higher-frequency-use 1 bit digital signal with the logic inverted and with a high drive capability.

The higher-frequency-use storage circuit 23 accumulates the output voltage of the higher-frequency-use inverter driver 22, outputs a voltage obtained by time-averaging the output signal, thereby generating an analog signal.

The filter 24 removes unnecessary higher-frequency components for a range that will not be used, from the higher-frequency-use analog signal outputted by the higher-frequency-use storage circuit 23.

The coupling capacitor 25 provides capacitive coupling for the higher-frequency-use analog signal, thereby preventing a DC component from being transmitted.

The lower-frequency-use level shifter 26 shifts up the output level of the lower-frequency-use 1 bit digital signal. Here, the output level is shifted up from 1.2 V to 3.3 V.

The lower-frequency-use inverter driver 27 outputs the lower-frequency-use 1 bit digital signal with the logic inverted and with a high drive capability.

The lower-frequency-use storage circuit 28 accumulates the output voltage of the lower-frequency-use inverter driver 27, and outputs a voltage obtained by time-averaging the output signal, thereby generating an analog signal.

With respect to the operational amplifier 29, an output from the lower-frequency-use storage circuit 28 is inputted to a positive side input terminal of the operational amplifier 29, and a source output from the output transistor 31 is inputted to a negative side input terminal of the operational amplifier 29, thereby applying a negative feedback thereto. The source output from the output transistor 31 also serves as an output to the next step.

The filter 30 serves as a wideband amplitude modulator as shown in FIG. 2, along with the operational amplifier 29 and the output transistor 31. A resistance is connected in series to an output terminal of the operational amplifier 29, a capacitor is connected in parallel with the line in which the resistance is provided, the output from the higher-frequency-use storage circuit 23 is synthesized at a point in the line ("VG" in FIG. 6), and the line is connected to a gate of the output transistor 31.

The output transistor 31 is an Nch transistor. Its drain is connected to the supply voltage and its source is connected to the negative side input terminal of the operational amplifier 29, thereby applying a negative feedback thereto, and also serves as an output to the next step.

Here, lower frequency components of the analog signal inputted to the positive side input terminal of the operational amplifier 29 and higher frequency components of the analog signal inputted to the gate of the output transistor 31 are synthesized together, thereby realizing a wide band amplitude modulation.

Further, since the higher-frequency-use analog signal is capacitively coupled by the coupling capacitor 25, the DC component is not transmitted. Further, for the lower-frequency-use analog signal (including the DC component), even if the potential difference (VGS) between VG-Vouts fluctuates in a DC manner due to a change in outside air temperature or the like, the feedback effect of the operational amplifier 29 prevents distortion and signal degradation in principle.

The drain-source voltage (Ids) in the saturation region of the Nch transistor can be expressed as equation 3.

$$Ids = k(VGS-Vt)^2 \qquad \text{equation 3}$$

where VGS is a potential difference between VG-Vouts, $k=(1/2) \times const \times (W/L)$, W is a gate width of the Nch transistor, L is a gate length, and Vt is a threshold value.

As seen from equation 3, the drain-source voltage (Ids) is sensitive to the fluctuation of the potential difference between VG-Vouts. Moreover, since Vt has a temperature dependency, it is desirable to perform some compensation process. For example, before shipment from a factory, the potential difference between VG-Vouts for the frequency of each measurement input signal is measured while changing the ambient temperature, and based on the measured values, a correction table for the whole bandwidth is prepared for each ambient temperature. Then, in operation, the ambient temperature is measured, a correction table corresponding to the ambient temperature is read, and a correction process may be performed for a corresponding frequency range by the distortion correction circuit 13.

<Summary>

As described above, in the amplitude modulator according to the present embodiment, digital data for wide bandwidth use is split into data for higher frequency use and data for lower frequency use. The two kinds of data is digital processed and then modulated individually, inputted to the first input terminal for higher frequency use and the second input terminal for lower frequency use, respectively, and then synthesized together so as to have a uniform frequency characteristic. This can widen the bandwidth, without using a high-performance, expensive operational amplifier to realize a good performance over a wide bandwidth.

INDUSTRIAL APPLICABILITY

The amplitude modulator of the present invention can be used in any communication apparatus and can realize a wide band modulation exceeding the ability of an operational amplifier. Therefore, it is appropriate for a general-purpose mobile communication apparatus such as a mobile phone for which lower cost and lower power consumption are expected.

DESCRIPTION OF THE REFERENCE CHARACTERS

1 amplitude modulator
10 signal processing means
11 lower-frequency-use delta sigma modulation circuit
12 delay circuit
13 distortion correction circuit
14 higher-frequency-use delta sigma modulation circuit
20 modulation synthesis means
21 higher-frequency-use level shifter
22 higher-frequency-use inverter driver
23 higher-frequency-use storage circuit
24 filter
25 coupling capacitor
26 lower-frequency-use level shifter
27 lower-frequency-use inverter driver
28 lower-frequency-use storage circuit
29 operational amplifier
30 filter
31 output transistor
100 mobile phone
101 operation section
102 opening and closing section
103 first display section
104 second display section
200 amplitude modulator
201 operational amplifier
202 resistance
203 capacitor
204 signal synthesizer

The invention claimed is:

1. An amplitude modulator comprising:

a signal processing section for receiving a source signal for wide bandwidth use, splitting the received source signal into two source signals which are for lower frequency use and for higher frequency use, respectively, signal processing the two source signals individually, and outputting a lower-frequency-use source signal and a higher-frequency-use source signal;

a first modulation section for modulating the lower-frequency-use source signal outputted by the signal processing section and outputting a lower-frequency-use modulation signal;

a second modulation section for modulating the higher-frequency-use source signal outputted by the signal processing section and outputting a higher-frequency-use modulation signal; and a synthesis output section for inputting the lower-frequency-use modulation signal outputted by the first modulation section to a first input terminal, the input of the lower-frequency-use modulation signal causing extraction of only a lower-frequency component, for inputting the higher-frequency-use modulation signal outputted by the second modulation section to a second input terminal, the input of the higher-frequency-use modulation signal causing extraction of only a higher-frequency component, for synthesizing the higher-frequency component and the lower-frequency component, and for outputting a modulated signal which corresponds to the source signal for wide bandwidth use, to a next step, wherein in the synthesis output section, the first input terminal is a positive side input terminal of an operational amplifier, a resistance is connected in series to an output terminal of the operational amplifier, and a capacitor is connected in parallel with a line in which the resistance is provided, an end of the line is connected to a gate of an output transistor, and serves as the second input terminal, and a source of the output transistor is connected to a negative side input terminal of the operational amplifier, and serves as an output to the next step.

2. A mobile phone comprising:
the amplitude modulator according to claim 1; and
a communication circuit which realizes a call function by use of the amplitude modulator.

3. An amplitude modulator comprising:

a signal processing section for receiving a source signal for wide bandwidth use, splitting the received source signal into two source signals which are for lower frequency use and for higher frequency use, respectively, signal processing the two source signals individually, and outputting a lower-frequency-use source signal and a higher-frequency-use source signal;

a first modulation section for modulating the lower-frequency-use source signal outputted by the signal processing section and outputting a lower-frequency-use modulation signal;

a second modulation section for modulating the higher-frequency-use source signal outputted by the signal processing section and outputting a higher-frequency-use modulation signal; and a synthesis output section for inputting the lower-frequency-use modulation signal outputted by the first modulation section to a first input terminal, the input of the lower-frequency-use modulation signal causing extraction of only a lower-frequency component, for inputting the higher-frequency-use modulation signal outputted by the second modulation section to a second input terminal, the input of the higher-frequency-use modulation signal causing extraction of only a higher-frequency component, for synthesizing the higher-frequency component and the lower-frequency component, and for outputting a modulated signal which corresponds to the source signal for wide bandwidth use, to a next step, wherein the signal processing section includes a delay section which performs delay process on at least one of the lower-frequency-use source signal and the higher-frequency-use source signal so as to prevent a time lag therebetween in the synthesis output section.

4. A mobile phone comprising:
the amplitude modulator according to claim 3; and
a communication circuit which realizes a call function by use of the amplitude modulator.

5. An amplitude modulator comprising:

a signal processing section for receiving a source signal for wide bandwidth use, splitting the received source signal into two source signals which are for lower frequency use and for higher frequency use, respectively, signal processing the two source signals individually, and outputting a lower-frequency-use source signal and a higher-frequency-use source signal;

a first modulation section for modulating the lower-frequency-use source signal outputted by the signal processing section and outputting a lower-frequency-use modulation signal;

a second modulation section for modulating the higher-frequency-use source signal outputted by the signal processing section and outputting a higher-frequency-use modulation signal; and a synthesis output section for inputting the lower-frequency-use modulation signal outputted by the first modulation section to a first input terminal, the input of the lower-frequency-use modulation signal causing extraction of only a lower-frequency component, for inputting the higher-frequency-use modulation signal outputted by the second modulation section to a second input terminal, the input of the higher-frequency-use modulation signal causing extraction of only a higher-frequency component, for synthesizing the higher-frequency component and the lower-frequency component, and for outputting a modulated signal which corresponds to the source signal for wide bandwidth use, to a next step, wherein the source signal is multiple-bit digital data, the signal processing section outputs two 1 bit digital signals which are for lower frequency use and higher frequency use, respectively, as the lower-frequency-use source signal and the higher-frequency-use source signal, respectively, the first modulation section receives the lower-frequency-use 1 bit digital signal, shifts up a signal level thereof, and outputs an analog voltage signal obtained by time-averaging the lower-frequency-use 1 bit digital signal whose signal level has been shifted up, as the lower-frequency-use modulation signal, and the second modulation section receives the higher-frequency-use 1 bit digital signal, shifts up a signal level thereof, and outputs an analog voltage signal obtained by time-averaging the higher-frequency-use 1 bit digital signal whose signal level has been shifted up, as the higher-frequency-use modulation signal.

6. A mobile phone comprising:
the amplitude modulator according to claim 5; and
a communication circuit which realizes a call function by use of the amplitude modulator.

* * * * *